United States Patent
Chang et al.

(10) Patent No.: US 7,663,231 B2
(45) Date of Patent: Feb. 16, 2010

(54) IMAGE SENSOR MODULE WITH A THREE-DIMENSIONAL DIE-STACKING STRUCTURE

(75) Inventors: Shu-Ming Chang, Hsinchu (TW); Tzu-Ying Kuo, Hsin Chu Hsien (TW); Chia-Wen Chiang, Hsin Chu Hsien (TW); Hsiang-Hung Chang, Hsin Chu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/010,617

(22) Filed: Jan. 28, 2008

(65) Prior Publication Data

US 2008/0308928 A1 Dec. 18, 2008

(30) Foreign Application Priority Data

Jun. 13, 2007 (TW) ............................... 96121327 A (51) Int. Cl.
*H01L 23/34* (2006.01)
(52) U.S. Cl. ............... 257/724; 257/725; 257/E23.124; 257/E23.145
(58) Field of Classification Search ................. 257/724, 257/725, E23.124, E23.145
See application file for complete search history.

(56) References Cited

U.S. PATENT DOCUMENTS

| 5,051,802 | A | 9/1991 | Prost et al. |
| 6,429,036 | B1 | 8/2002 | Nixon et al. |
| 6,646,289 | B1 | 11/2003 | Badehi |
| 7,061,106 | B2 | 6/2006 | Yang et al. |
| 7,115,961 | B2 | 10/2006 | Watkins et al. |
| 7,361,989 | B1 * | 4/2008 | Adkisson et al. ............ 257/737 |
| 7,368,695 | B2 * | 5/2008 | Kang et al. ............... 250/208.1 |
| 2005/0279916 | A1 * | 12/2005 | Kang et al. ............... 250/208.1 |
| 2008/0073742 | A1 * | 3/2008 | Adkisson et al. ............ 257/443 |
| 2008/0211045 | A1 * | 9/2008 | Ono ............................ 257/432 |
| 2009/0041448 | A1 * | 2/2009 | Georgiev et al. ............ 396/268 |

* cited by examiner

*Primary Examiner*—Ngan Ngo
(74) *Attorney, Agent, or Firm*—Birch, Stewart, Kolasch & Birch, LLP (57) ABSTRACT

This invention provides an image sensor module with a three-dimensional die-stacking structure. By filling a conductive material into through silicon vias within at least one image sensor die, and into via holes within an insulating layer, vertical electrical connections are formed between the image sensor die and an image processor buried in the insulating layer. A plurality of solder bumps is formed on a backside of the image sensor module so that the module can be directly assembled onto a circuit board. The image sensor module of this invention is characterized by a wafer-level packaging architecture and a three-dimensional die-stacking structure, which reduces electrical connection lengths within the module and thus reduces an area and height of the whole packaged module.

9 Claims, 8 Drawing Sheets

IMAGE SENSOR MODULE WITH A THREE-DIMENSIONAL DIE-STACKING STRUCTURE

BACKGROUND OF THE INVENTION

1. Field of the Invention

The present invention relates to a package structure for an image sensor module, and more particularly to a package structure for an image sensor module with a three-dimensional die-stacking structure.

2. Description of the Related Art

Image sensors have been widely applied to electronic devices like camera cell phones, digital cameras, and devices associated with medical diagnoses or security monitoring. There are always needs on the market for thinner and more compact devices wherein energy loss can be reduced and production cost can be lowered, especially when portable electronic devices or medical instruments are considered. There are several known types of package structure for an image sensor: FIG. 11A of U.S. Pat. No. 6,646,289 discloses a wafer-level package structure for an image sensor, which employs a redistributed layer to redistribute electrical connections from the edge to the backside surface of individual dies. The image sensor therein is sandwiched between two layers of glass. FIG. 3 of U.S. Pat. No. 5,051,802 discloses an image sensor which is thinned to an extremely minute thickness so that a die is transparent to light rays from the backside thereof. FIG. 1 of U.S. Pat. No. 7,061,106 discloses an image sensor module using an interposer to achieve electrical connections between an image sensor and another die; moreover, a lens component is disposed unto a top of the interposer. FIG. 2 of U.S. Pat. No. 6,429,036 discloses an image sensor, a protective upper substrate of which is drilled to form electrical conduction vias so that the circuits can extend out board. Electrical connections are then made between the protective upper substrate and the image sensor by connecting them with solder balls or with a metal layer.

As described above, a conventional package structure for an image sensor typically employs a two-dimensional die-stacking structure and connection, which results in a greater electrical connection length and a larger package size; therefore, conventional structures will not be able to meet the needs of future products that take compactness, energy efficiency and high performance as basic elements. If a two-dimensional distribution of electrical connections within a die is changed to a three-dimensional one, the technical flaws of a conventional two-dimensional package structure may be overcome.

SUMMARY OF THE INVENTION

The present invention provides an image sensor module with a three-dimensional die-stacking structure. The image sensor module includes at least one image sensor die and at least one image processor die underlying it. By employing vertical electrical conductive wires within the image sensor die, vertical and horizontal electrical connections between the image sensor die and the image processor die can be established, and therefore the electrical connection lengths within the image sensor module are reduced. A plurality of solder bumps are further formed on a backside of the image sensor module so that the module can be assembled onto a circuit board directly.

The present invention provides an image sensor module with a three-dimensional die-stacking structure, which comprises at least one image sensor die, at least one image processor die, an optically transparent substrate, and a plurality of electrical conductive pads. The image processor die and the image sensor die is stacked and jointed to each other, wherein a sensing surface of the image sensor die faces up, and the image sensor die is provided with a plurality of vertical electrical conductive wires so that vertical and horizontal electrical connections between the image sensor die and the image processor die are established. The optically transparent substrate is formed on the sensing surface of the image sensor die. The plurality of electrical conductive pads is formed on a backside of the image sensor module.

The image sensor module of the present invention is characterized by a wafer-level package architecture and a three-dimensional die-stacking structure; such characteristic reduces the electrical connection lengths within the module. Therefore, the area and height of the whole package are reduced, and the component density per unit area will be increased accordingly.

Moreover, active or passive components, for example, radio-frequency components, light emitting diode devices or antennas, can also be combined and stacked in the image sensor module of the present invention so that the module further contains a wireless transmission or self-luminous function.

DETAILED DESCRIPTION OF THE PREFERRED EMBODIMENT

The image sensor module with a three-dimensional die-stacking structure of the present invention is accomplished by employing a wafer-level three-dimensional packaging process. What follows explains the wafer-level packaging process according to one embodiment of this invention.

Figure 1A:
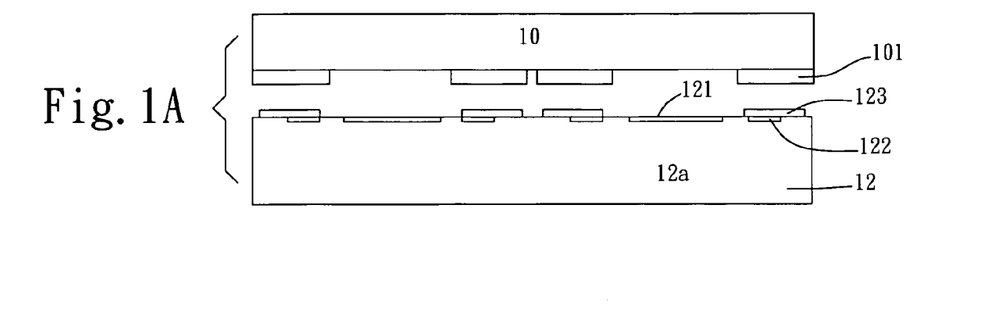
FIG. 1A through FIG. 1I shows schematic cross-sectional views corresponding to various stages of a method for forming an image sensor module with a three-dimensional die-stacking structure according to a first embodiment of the present invention.
Figure 1B:
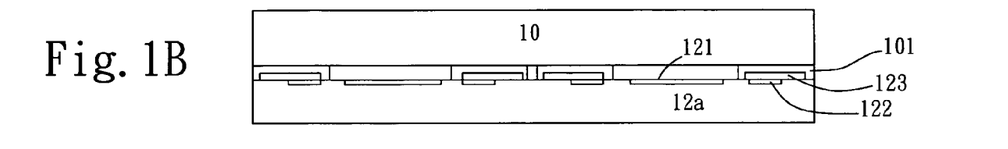
Figure 1C:
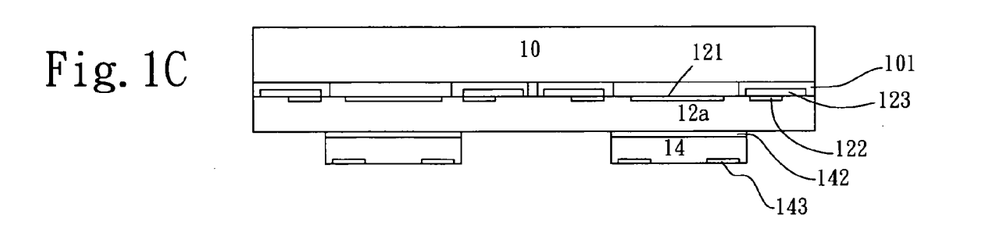
Figure 1D:
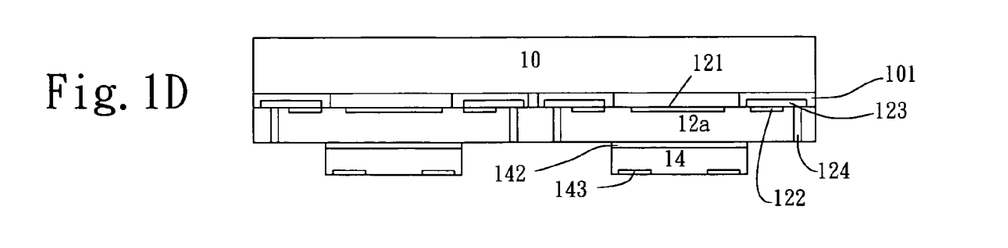
Figure 1E:
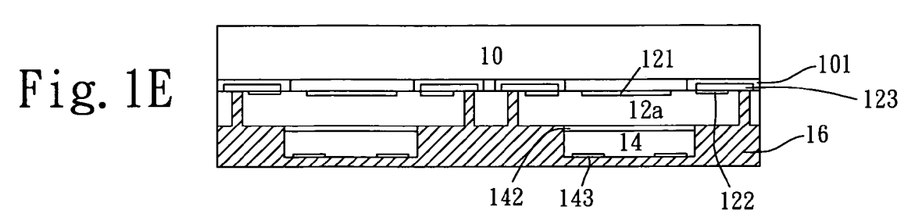
Figure 1F:
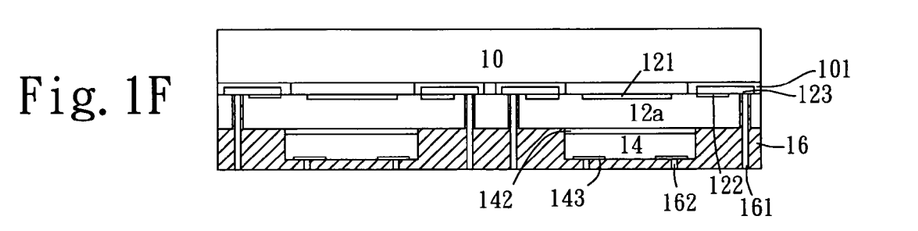
Figure 1G:
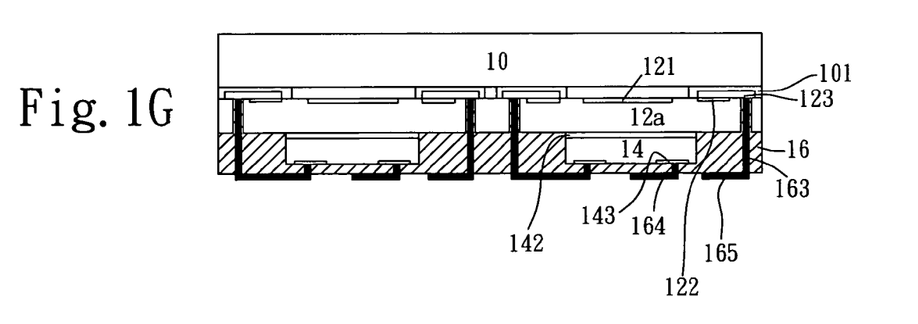
Figure 1H:
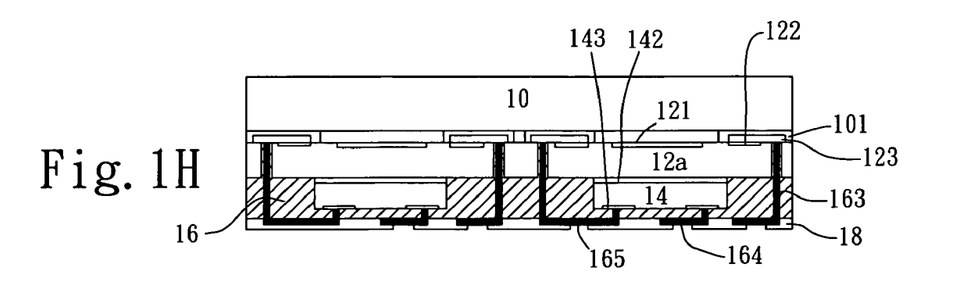
Figure 1I:
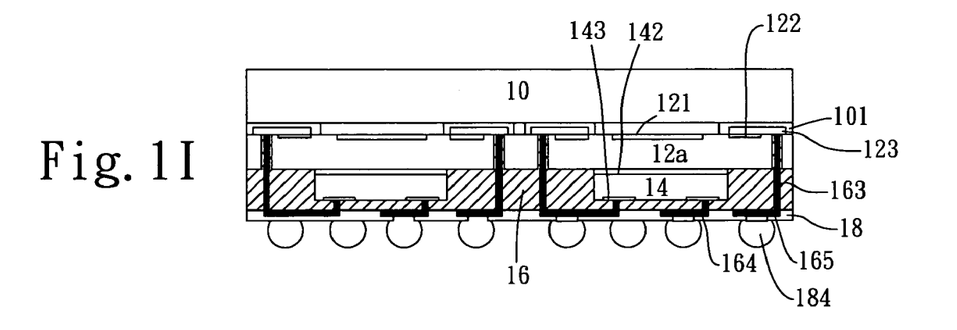
Figure 2:
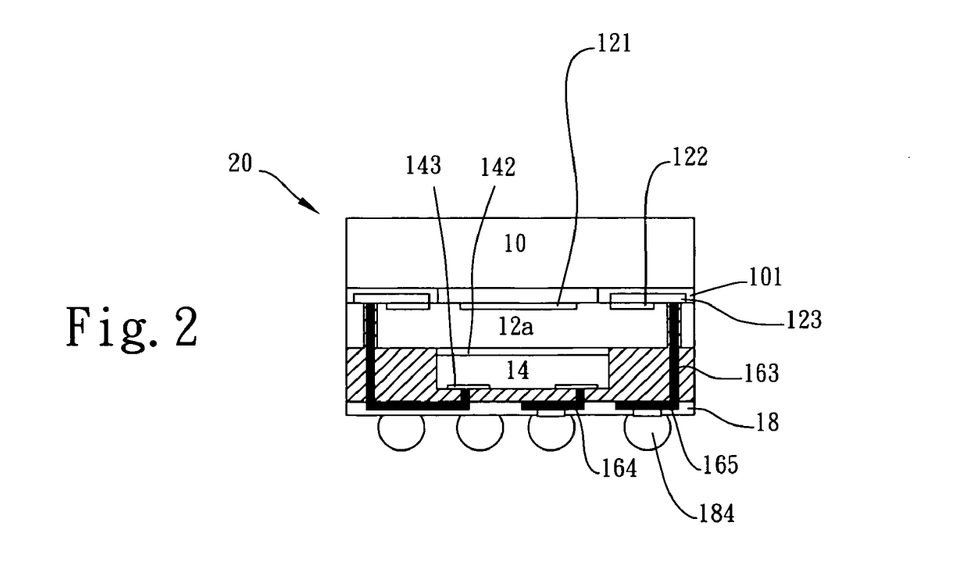
FIG. 2 shows a schematic cross-sectional view of the image sensor module according to the first embodiment of the present invention.

FIG. 2 is a schematic cross-sectional view of an image sensor module with a three-dimensional die-stacking structure in accordance with a first embodiment of the invention. FIG. 1A through FIG. 1I is schematic cross-sectional views respectively corresponding to various stages in a process of forming the image sensor module 20 of FIG. 2. With reference to FIG. 1A first, an optically transparent substrate 10 and an image sensor wafer 12 are provided. The optically transparent substrate 10 can be made of glass or other polymer material. The image sensor wafer 12 includes a plurality of image sensor dies 12a, e.g., CMOS image sensor dies. Each of the image sensor dies 12a has a light sensitive area 121 and a plurality of metal layers 122, which are formed on an upper surface of the image sensor die 12a. A plurality of metal pads 123, e.g., aluminum pads, is formed correspondingly under each of the metal layers 122 within the image sensor die 12a, and electrically contacting the metal layers 122. The present invention uses an adhesive layer 101 to joint a lower surface of the optically transparent substrate 10 and the upper surface of the image sensor wafer 12, to form a structure as shown in FIG. 1B. The adhesive layer 101 can be made of an inorganic material, polymer material, or any combination of them. The optically transparent substrate 10 is used for protecting each of the image sensor dies 12a. With still reference to FIG. 1B, the backside surface of the image sensor wafer 12 is made thin with a wafer grinding technique. With reference to FIG. 1C, a plurality of image processor dies 14, each with its front side facing up, is stacked and jointed to the lower surface of one of the image sensor dies 12a by using a die attach film 142. A plurality of pads 143 is formed on a lower surface of each of the image processor dies 14. With reference to FIG. 1D, by using laser drilling or etching techniques, a plurality of through silicon vias (TSVs) 124 are formed within the image sensor wafer 12. Each of TSVs 124 passes through the image sensor wafer 12 to reach one of the metal layers 122. With reference to FIG. 1E, insulating material 16 is coated or pressed to embed the image processor dies 14. The insulating material 16 also fills the TSVs 124 in the image sensor wafer 12. With reference to FIG. 1F, a plurality of via holes 161 and 162 are formed, each via hole 161 extending through the insulating material 16 and each TSV 124 in the image sensor wafer 12 to reach the metal layer 122, and each via hole 162 extending through the insulating material 16 to reach the pad 143 in the image processor die 14. With reference to FIG. 1G, a conductive material, such as metal, is filled into the via holes 161 and 162, by using sputtering, electroless plating or electroplating techniques, to form internal electrical connections 163 and 164. At the same time, a redistributed layer 165 is formed on a surface of the insulating material 16, and therefore, horizontal and vertical electrical connections are established between the image sensor die 12a and the pad 143 in the image processor 14. With reference to FIG. 1H, a protective layer 18 is formed under the insulating material 16 by using coating or pressing techniques; furthermore, a plurality of solder bump pad openings 182 is formed within the protective layer 18, each of the solder bump pad openings 182 under one of the internal electrical connections 163 or under one the internal electrical connections 164. With reference to FIG. 1I, an electrical conductive pad 183, e.g. a metal pad, is formed at each of the bump pad openings 182, and then, a solder bump 184 is formed under the electrical conductive pad 183 by using planting, printing or electroplating techniques. The image sensor module of the present invention, which is packaged at the wafer level, is thus formed; then, the wafer is diced along dicing lines to separate the image sensor modules 20, which have a die-size package structure, from the wafer. FIG. 2 illustrates a cross-sectional view of the structure of the image sensor module 20. The aforementioned image sensor module 20 can be assembled directly onto a printed circuit board (not shown) with the use of the solder bumps 184.

As shown in FIG. 2, the image sensor module 20 of the present invention is characterized by its three-dimensional die-stacking structure. This characteristic is achieved by using the die attach film 142 to stack and joint the image sensor die 12a and the image processor die 14 to each other. The characteristic is further achieved by filling an electrical conductive material into the TSVs in the image sensor die 12a and into the via holes in the insulating material 16 to form internal electrical connections 163 and 164; at the same time, the redistributed layer 165 is formed on the surface of the insulating material 16 to electrically connect with the internal electrical connections 163 and 164. With the method described above, vertical and horizontal electrical connections are established between the image sensor die 12a and the image processor 14, and thus, the electrical connection lengths within the image sensor module 20 are reduced, whereby energy loss is reduced accordingly. Moreover, the area and height of the whole package can be decreased by using this three-dimensional die-stacking package structure for the image sensor module 20. As a result, the manufacture cost can be reduced since the component density per unit area is increased effectively.

Figure 3:
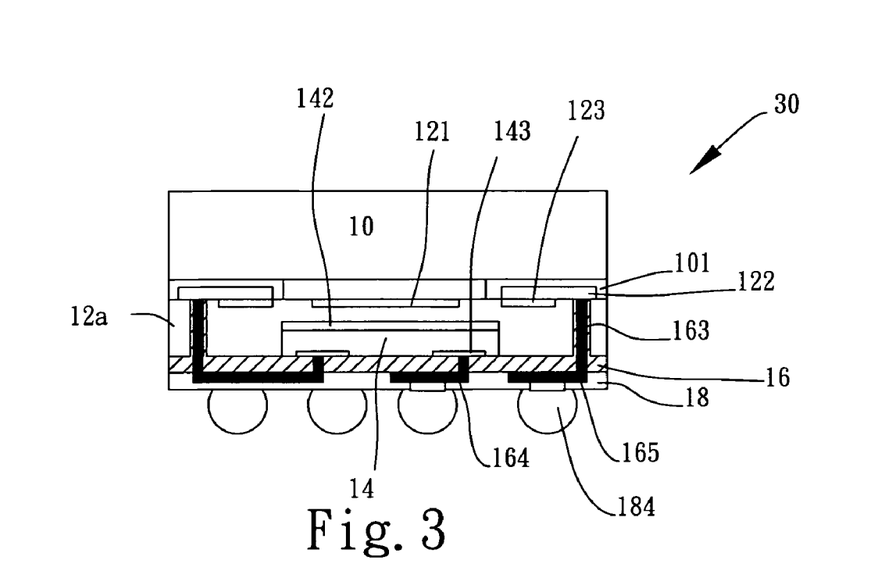
FIG. 3 shows a schematic cross-sectional view of an image sensor module according to a second embodiment of the present invention.
Figure 4:
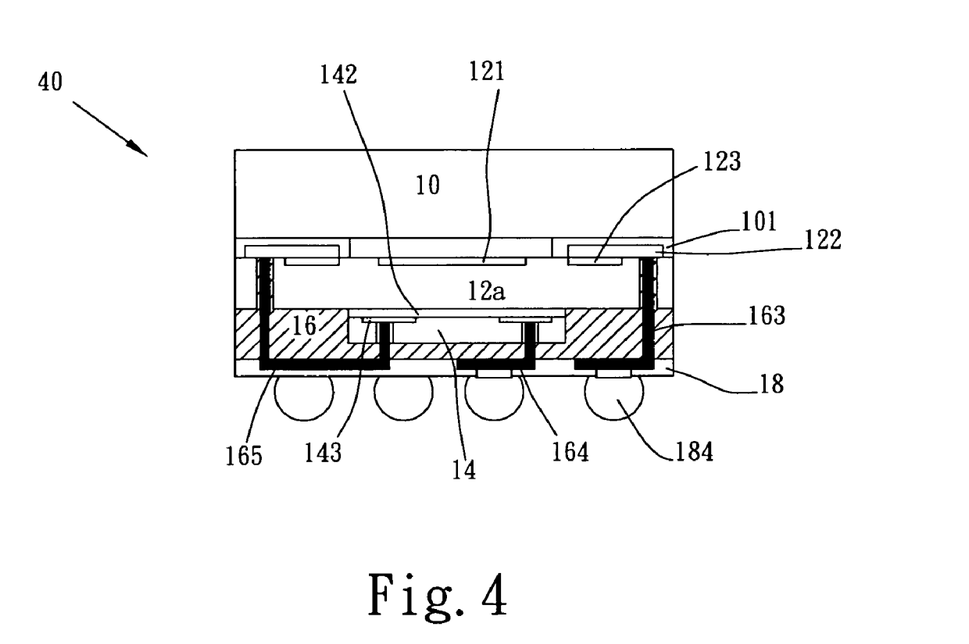
FIG. 4 shows a schematic cross-sectional view of an image sensor module according to a third embodiment of the present invention.
Figure 5:
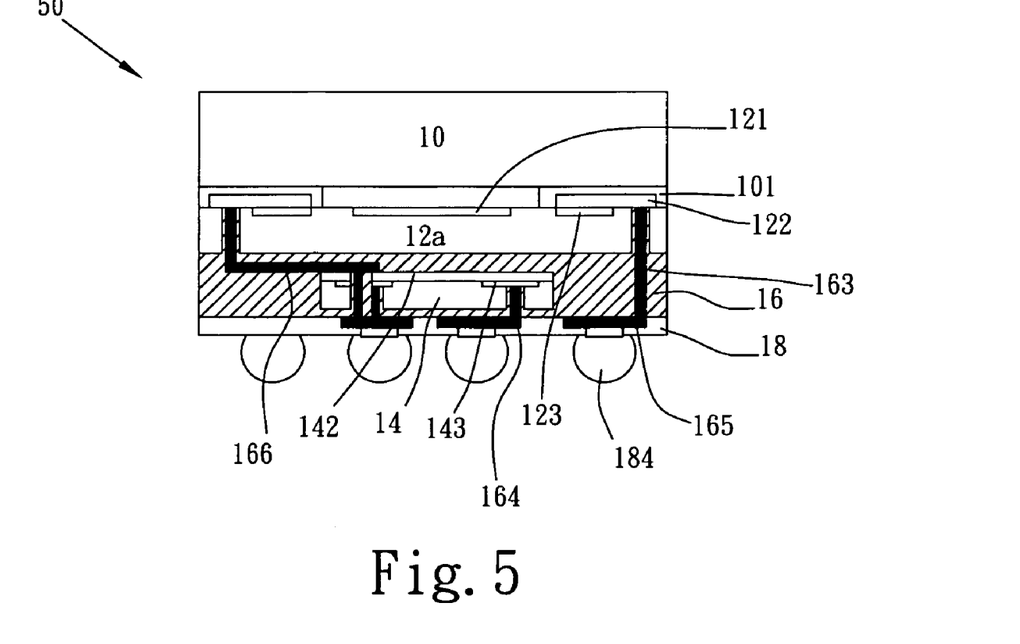
FIG. 5 shows a schematic cross-sectional view of an image sensor module according to a fourth embodiment of the present invention.

FIG. 3 is a schematic cross-sectional view of an image sensor module with a three-dimensional die-stacking structure in accordance with a second embodiment of the invention. The image sensor module 30 of the second embodiment is different from the image sensor module 20 of the first embodiment in that a plurality of slots is formed at the backside of the image sensor wafer 12 first. That is to say, a slot is formed at the backside of each of the image sensor dies 12a. An image processor die 14, with its front side facing up, is then placed in the slot, and a die attach film 142 is used to joint the image sensor die 12a and the image processor die 14. FIG. 4 is a schematic cross-sectional view of an image sensor module with a three-dimensional die-stacking structure in accordance with a third embodiment of the invention. The image sensor module 40 of the third embodiment is different from the image sensor module 20 of the first embodiment in that the image processor die 14 is jointed to the image sensor die 12a with the backside of the image processor die 14 facing up. In this third embodiment of the invention, moreover, a horizontal electrical connection of the image sensor die 12a with the image processor die 14 is formed between the image processor die 14 and the solder bumps 184. FIG. 5 is a schematic cross-sectional view of an image sensor module with a three-dimensional die-stacking structure in accordance with a fourth embodiment of the invention. The image sensor module 50 of the fourth embodiment is different from the image sensor module 40 of the third embodiment in that the horizontal electrical connection of the image sensor die 12a with the image processor die 14 is formed between the image sensor die 12a and the image processor die 14.

Figure 6:
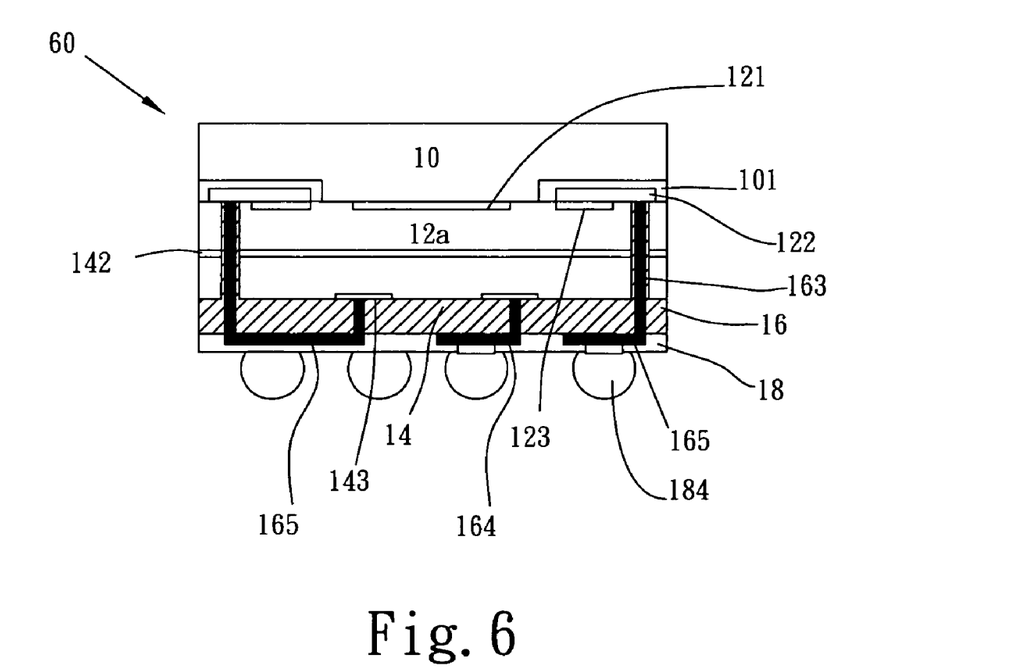
FIG. 6 shows a schematic cross-sectional view of an image sensor module according to a fifth embodiment of the present invention.

FIG. 6 is a schematic cross-sectional view of an image sensor module with a three-dimensional die-stacking structure in accordance with a fifth embodiment of the invention.

Figure 7:
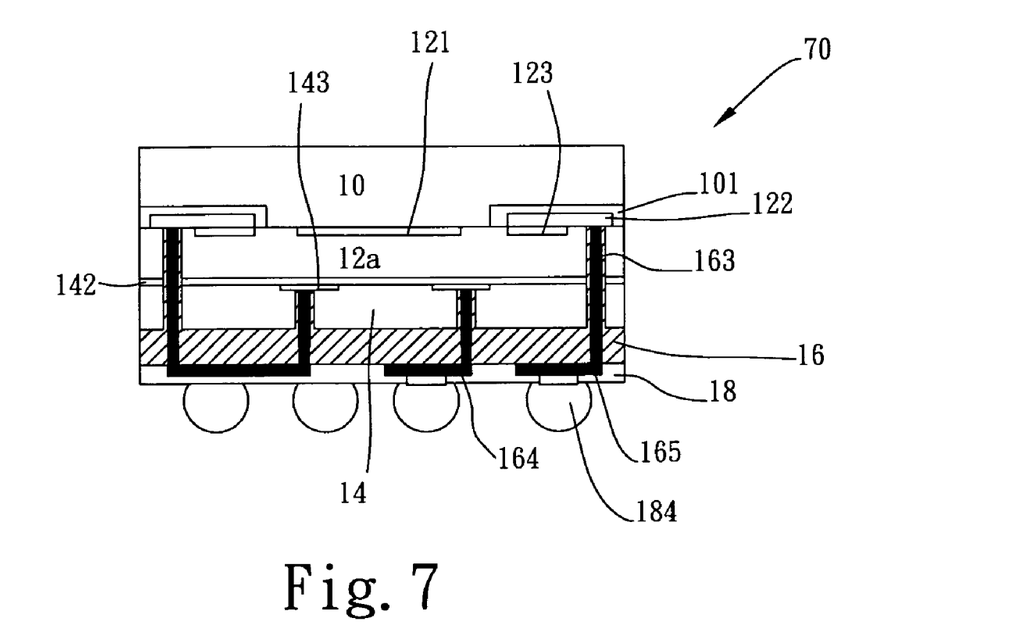
FIG. 7 shows a schematic cross-sectional view of an image sensor module according to a sixth embodiment of the present invention.
Figure 8:
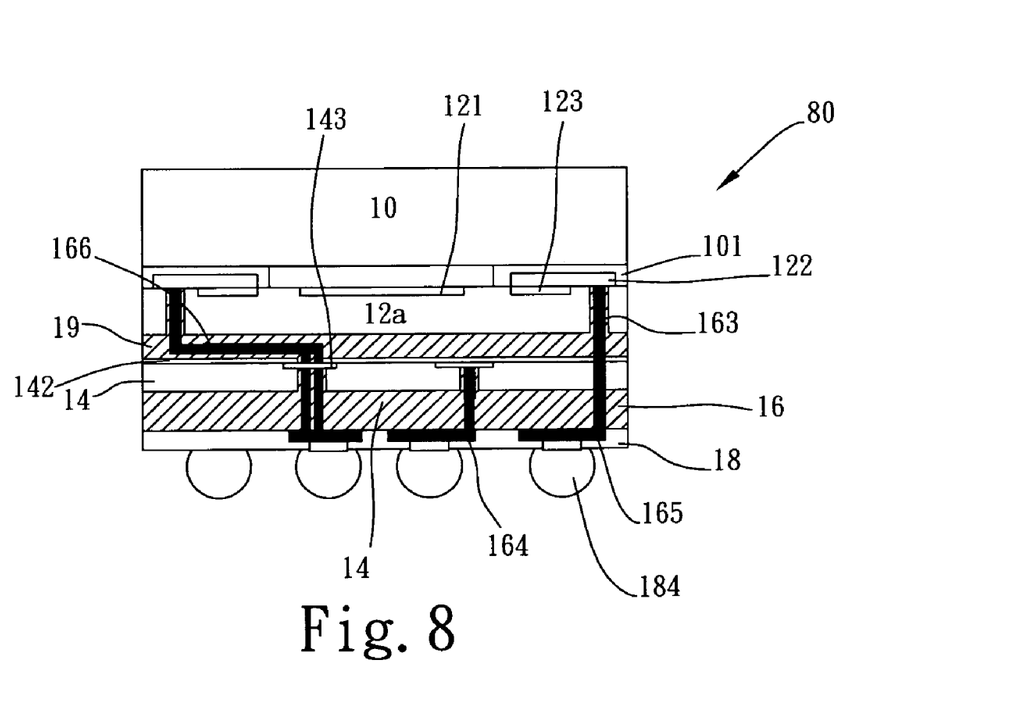
FIG. 8 shows a schematic cross-sectional view of an image sensor module according to a seventh embodiment of the present invention.

The image sensor module 60 of the fifth embodiment is different from the image sensor module 20 of the first embodiment in that the image processor die 14 and the image sensor die 12a are of identical size, and that the image processor die 14 is not buried in the insulating material 16. In the illustrated embodiment, a plurality of TSVs extends through the image sensor die 12a and the image processor die 14. By filling an electrical conductive material into the TSVs and into the via holes within the insulating material 16, internal electrical connections 163 and 164 are formed; at the same time, a redistributed layer 165 is formed on the surface of the insulating material 16. The vertical and horizontal electrical connections between the image sensor die 12a and the image processor die 14 are thus formed. In other words, the horizontal electrical connections of the image sensor die 12a and the image processor die 14 are formed between the image processor die 14 and the solder bumps 184. FIG. 7 is a schematic cross-sectional view of an image sensor module with a three-dimensional die-stacking structure in accordance with a sixth embodiment of the invention. The image sensor module 70 of the sixth embodiment is different from the image sensor module 60 of the fifth embodiment in that the image processor die 14 is jointed to the bottom of the image sensor die 12a with its backside facing up. Thus, the internal electrical connections 163 and 164 between the image sensor die 12a and the image processor die 14 are formed at the backside of the image processor die 14. FIG. 8 is a schematic cross-sectional view of an image sensor module with a three-dimensional die-stacking structure in accordance with a seventh embodiment of the invention. The image sensor module 80 of the seventh embodiment is different from the image sensor module 70 of the sixth embodiment in that an insulating layer 19 is placed between the image sensor die 12a and the image processor die 14. Thus, the horizontal electrical connections of the image sensor die 12a and the image processor die 14 is formed within the insulating layer 19, which is between the image sensor die 12a and the image processor die 14.

In addition, in the aforementioned embodiments, active components or passive components, e.g., radio-frequency (RF) components, light-emitting diode (LED) devices or antennas, can also be stacked and combined into the image sensor module with a three-dimensional die-stacking structure of this invention so that the module will further contain wireless transmission and/or self-luminous functions.

Furthermore, the aforementioned image sensor die 12a and image processor die 14 of this invention can also be integrated into a system-on-chip (SOC) die. There can be another SOC die, which may include components of memories, RF components, integrated passive devices (IPD), discrete passive components or any combination of them, connected to a bottom of the integrated SOC die.

Figure 9:
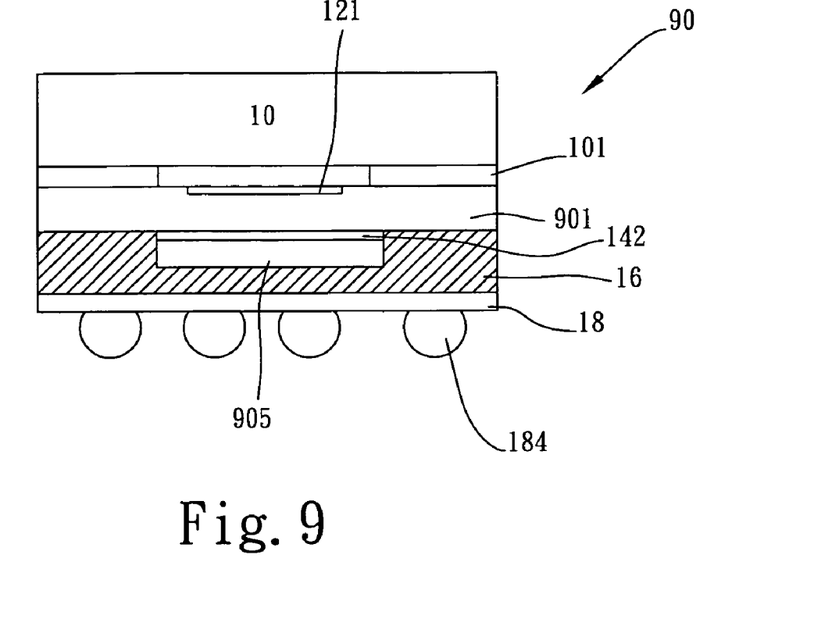
FIG. 9 shows a schematic cross-sectional view of an image sensor module according to an eighth embodiment of the present invention.

FIG. 9 is a schematic cross-sectional view of an image sensor module with a three-dimensional die-stacking structure in accordance with an eighth embodiment of the invention. In this illustrated embodiment, the image sensor module 90 of the invention includes an optically transparent substrate 10, an image sensor die 901 with image processing capabilities, a SOC die 905 integrating memories, RF components and IPDs (Integrated Passive Devices), an insulating material 16, a protective layer 18, and a plurality of solder bumps 184. The image sensor die 901 has a light sensitive area 121 jointed to a bottom of the optically transparent substrate 10 by using an adhesive layer 101. The SOC die 905 is buried in the insulating material 16 and jointed to a backside of the image sensor die 901 by using a die attach film 142. The protective layer 18 is formed under the image sensor die 901, and the solder bumps 184 are formed at the pad openings (not shown) of the protective layer 18. With the solder bumps 184, the image sensor module 90 of this invention can be assembled directly onto a circuit board, such as a printed circuit board.

Figure 10:
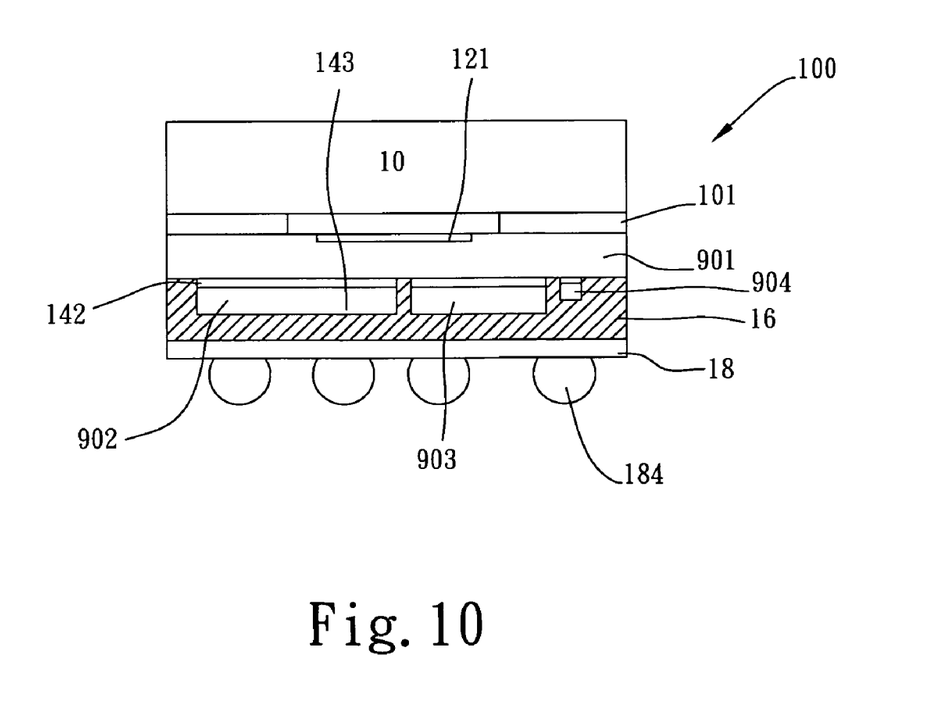
FIG. 10 shows a schematic cross-sectional view of an image sensor module according to a ninth embodiment of the present invention.
Figure 11:
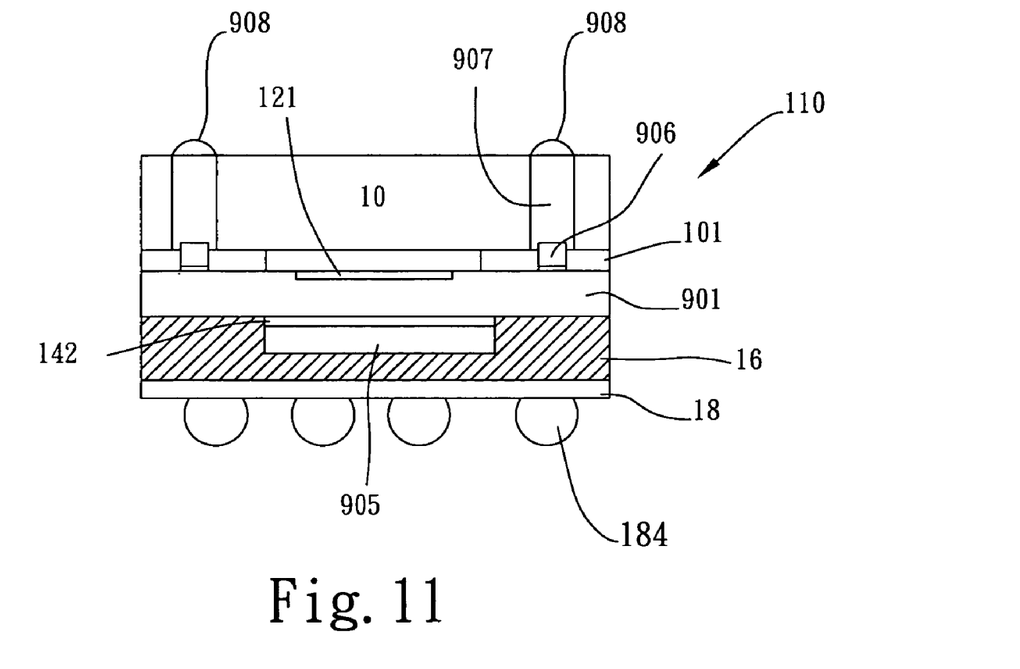
FIG. 11 shows a schematic cross-sectional view of an image sensor module according to a tenth embodiment of the present invention.
Figure 12:
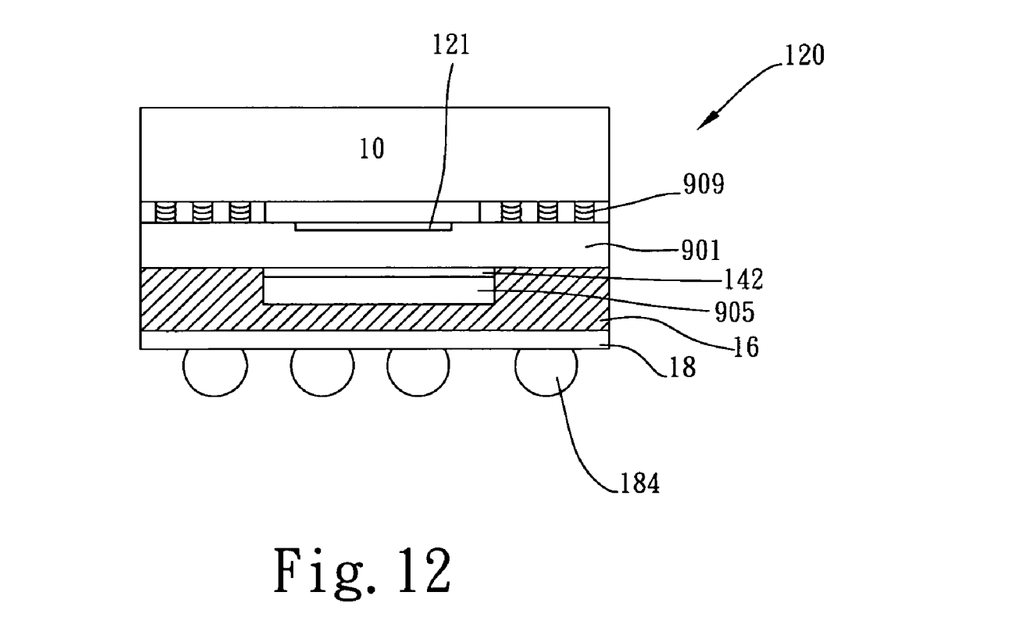
FIG. 12 shows a schematic cross-sectional view of an image sensor module according to an eleventh embodiment of the present invention.

FIG. 10 is a schematic cross-sectional view of an image sensor module with a three-dimensional die-stacking structure in accordance with a ninth embodiment of the invention. The image sensor module 100 of the ninth embodiment is different from the image sensor module 90 of the eighth embodiment in that a memory 902, a RF component 903 and an IPD 904 are buried in the insulating material 16 and respectively jointed to the backside of the image sensor die 901 by using the die attach films 142. FIG. 11 is a schematic cross-sectional view of an image sensor module with a three-dimensional die-stacking structure in accordance with a tenth embodiment of the invention. The image sensor module 110 of the tenth embodiment is different from the image sensor module 90 of the eighth embodiment in that at least one LED device 906 is placed on the image sensor die 901, that a light-guiding channel 907 is formed within the optically transparent substrate 10 corresponding with each LED device 906, and that a lens element 908 is formed on a top of the light-guiding channel 907. The image sensor module 110, as a result, contains a self-luminous function. FIG. 11 is a schematic cross-sectional view of an image sensor module with a three-dimensional die-stacking structure in accordance with an eleventh embodiment of the invention. The image sensor module 120 of the eleventh embodiment is different from the image sensor module 90 of the eighth embodiment in that antenna structures 909 are formed on an upper surface of the image sensor die 901 using sputtering or electroplating techniques. The image sensor module 120, as a result, contains a wireless transmission function.

While the invention has been described by way of examples and in terms of preferred embodiments, it is to be understood that various changes, substitutions, and alterations can be made herein without departing from the spirit and scope of the invention as defined by the appended claims.

What is claimed is:

1. An image sensor module with a three-dimensional die-stacking structure, comprising:
   at least one image sensor die;
   at least one image processor die, said image processor die and said image sensor die being stacked and jointed to each other, wherein a sensing surface of said image sensor die faces up, and said image sensor die is provided with a plurality of vertical electrical conductive wires passing therethrough;
   an optically transparent substrate formed on said sensing surface of said image sensor die;
   an insulating layer in which said image processor die is buried and said electrical conductive wires pass therethrough so that vertical and horizontal electrical connections between said image sensor die and said image processor die are established; and
   a plurality of electrical conductive pads formed on a backside of said image sensor module.

2. The image sensor module with a three-dimensional die-stacking structure of claim 1, wherein a backside of said image sensor die has a slot for placing said image processor die.

3. The image sensor module with a three-dimensional die-stacking structure of claim 1, wherein said image processor die is stacked under said image sensor die in a manner of a front side of said image processor die facing up or facing down.

4. The image sensor module with a three-dimensional die-stacking structure of claim 1, wherein the horizontal electrical connections are established between said image processor die and said electrical conductive pads, or between said image processor die and said image sensor die.

5. The image sensor module with a three-dimensional die-stacking structure of claim 1, wherein at least one of said vertical electrical conductive wires passes through said image sensor die and said image processor die.

6. The image sensor module with a three-dimensional die-stacking structure of claim 5, wherein the horizontal electrical connections are established between said image processor die and said electrical conductive pads, or between said image processor die and said image sensor die.

7. The image sensor module with a three-dimensional die-stacking structure of claim 5, wherein said image processor die is stacked under said image sensor die in a manner of a front side of said image processor die facing up or facing down.

8. The image sensor module with a three-dimensional die-stacking structure of claim 1, further comprising an adhesive layer to joint said image sensor die and said image processor die.

9. The image sensor module with a three-dimensional die-stacking structure of claim 1, further comprising a plurality of solder bumps respectively formed under one of said electrical conductive pads corresponding thereto, wherein electrical connections between said image sensor module and the external are established through said solder bumps.

* * * * *